United States Patent [19]

Kulesa

[11] Patent Number: 5,481,566
[45] Date of Patent: Jan. 2, 1996

[54] METHOD AND APPARATUS TO INCREASE EFFICIENCY OF SYSTEMATIC CODES

[75] Inventor: Anthony G. Kulesa, Martinsville, N.J.

[73] Assignee: AT&T Corp., Murray Hill, N.J.

[21] Appl. No.: 175,008

[22] Filed: Dec. 29, 1993

[51] Int. Cl.⁶ .................................................. H04L 27/00
[52] U.S. Cl. ...................... 375/259; 375/295; 375/316; 375/341; 371/37.1
[58] Field of Search ...................... 375/341, 316, 375/259; 371/37.1, 39.1, 38.1, 37.7, 43

[56] References Cited

U.S. PATENT DOCUMENTS

| | | | |
|---|---|---|---|
| 3,697,949 | 10/1972 | Carter et al. | 371/40.1 |
| 4,077,028 | 2/1978 | Lui et al. | 371/40.1 |
| 4,107,650 | 8/1978 | Luke et al. | 371/39.1 |
| 4,156,867 | 5/1979 | Bench et al. | 371/37.7 |
| 4,312,069 | 1/1982 | Ahamed | 371/37.6 |
| 4,488,302 | 12/1984 | Ahamed | 371/39.1 |
| 4,605,921 | 8/1986 | Riddle et al. | 371/37.2 |
| 4,691,319 | 9/1987 | Bose et al. | 371/54 |
| 4,744,086 | 5/1988 | Komly et al. | 371/39.1 |
| 4,763,331 | 8/1988 | Matsumoto | 371/37.8 |
| 4,849,976 | 7/1989 | Schilling et al. | 371/37.4 |
| 4,899,340 | 2/1990 | Lubarsky | 371/37.1 |
| 5,010,554 | 4/1991 | Bechtel et al. | 371/37.1 |
| 5,179,560 | 1/1993 | Yamagishi et al. | 371/38.1 |
| 5,379,305 | 1/1995 | Wang | 371/37.1 |

OTHER PUBLICATIONS

"Error Control Coding Fundamentals & Applictions" Castello, Jr. et al. Prentice–Hall Inc., 1987.

*Primary Examiner*—Stephen Chin
*Assistant Examiner*—Tesfaldet Bocure

[57] ABSTRACT

A method and apparatus for increasing the coding efficiency of a digital data transmission system from k/n to (k+1)/n by truncating a check bit from a generated checkword and adding an extra information bit prior to transmission. The encoding algorithm at the receiver borrows the added information bit to replace the truncated check bit in order to perform error detection and correction n the entire codeword. If an error is detected at the shared bit position, the shared bit is not corrected by the decoding circuit since a detected error in that position is more likely a result of bit inversion due to replacement than due to a transmission fault. The coding efficiency of the transmission system is increased from k/n to (k+1)/n while the number of bit errors correctable by the system is only reduced to, on the average, $t-(\frac{1}{2})$ for some range of BER's.

12 Claims, 4 Drawing Sheets

MODIFIED CYCLIC DECODER FOR ENHANCED MODE

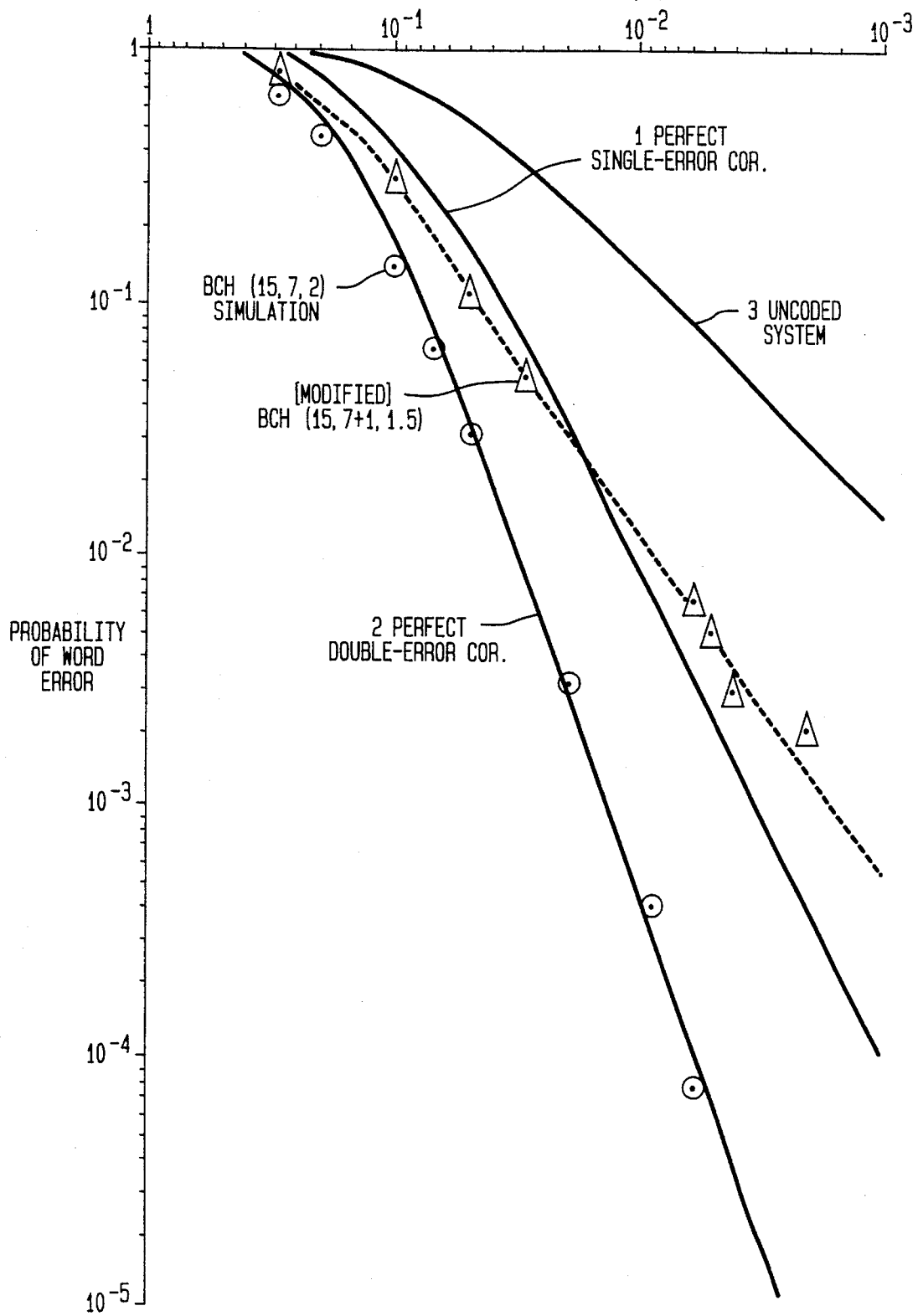

METHOD AND APPARATUS TO INCREASE EFFICIENCY OF SYSTEMATIC CODES

FIELD OF THE INVENTION

The present invention relates to the coding of digital data blocks for transmission in a data channel, and in particular to the modification of systematic channel codes to increase the effective information throughput of the channel.

BACKGROUND OF THE INVENTION

In digital data transmission systems, it is desired to be able to detect and correct bit errors introduced during transmission, preferably without requiring retransmission of the erroneous data. Known error correction systems generate at the transmitter a codeword which comprises some form of redundant, or "overhead," check bits in addition to the transmitted information. Calculations are performed at the receiver using the received codeword to extrapolate the information, and if errors are detected, to correct the data. The factors that can be traded off against each other and still provide effective error correction are the additional bandwidth and time required for transmission; the amount of time needed to perform the calculations; and the complexity and cost of the equipment.

In channel coding theory, a systematic code is defined as a code in which redundant parity check bits are concatenated with information data bits to form a codeword. That is, the information bits form a discrete, identifiable part of the transmitted codeword. A forward error correction (FEC) or detection code has r parity check bits, added to k information data bits to form a codeword of length n such that n=k+r. The r parity check bits are added in such a way as to allow a specified number of errors to be detected and/or corrected. The algorithm employed to generate the r parity-check bits for given information bits differs for each code.

Specific forward error correction and detection codes which are well known in the prior art include the Reed-Solomon code, the Golay code, the Bose-Chadhuri-Hocquenghem (BCH) code and the Hamming code. Each of these codes employs a different algorithm for generating the parity check bits and a correspondingly different algorithm for recovering the original k data bits or for detecting errors.

The forward error correction and detection codes are characterized by their algorithm for encoding and decoding and also by several other properties. The efficiency rate R is the ratio of information data bits k to the sum n of information data bits. The larger the number of information bits k contained in a given codeword of n total bits, the more efficient the codeword is. That is, the efficiency rate R= k/n.

The minimum Hamming distance, or code weight, d is the minimum number of bits by which two codewords differ. If there are k information bits in an uncoded word, there are $2^k$ possible uncoded information words (e.g., if k=4 there are 16 possible uncoded words). An error in any bit will make the word look like a different one of the $2^4$ words, and therefore an error cannot be correctly detected or corrected. However, if r parity check bits are added to the k-bit uncoded word, an n-bit codeword is formed. Hence, there are $2^n$ possible words of which only $2^k$ are used as valid information words. The selection of the codewords so as to ensure a maximum separation between the codewords is what makes a good error correcting code. For example, a Hamming code containing k= 4 information bits and n=7 coded bits has 16 valid codewords of a possible $2^7$=128 words. This is called a (n,k) or (7,4) code of efficiency rate R=4/7. These codewords are selected so that each codeword differs by 3 bits. Thus, a single error can be detected and corrected while two errors on a codeword can be detected but cannot be corrected. In the above example, the Hamming distance d=3. In general, a code can detect $d_{min}-1$ errors in a codeword and can correct t errors in a codeword, where $$t \leq (d_{min}-1)/2$$

Coding schemes are typically designed into communication systems to provide coding gain that results in an improved link Bit Error Rate (BER). If the modulation and channel bandwidth are fixed, and it is necessary to increase the information rate (or the channel coding efficiency), a commonly selected alterative is to choose another coding scheme with an increased coding efficiency and usually a reduced error correction capability.

In general, block codes are more efficient the larger the block size. However, as a practical matter, the block size often cannot be increased although it is desired to increase the efficiency. Although for a given block size n, the number of information bits k could be increased to increase the efficiency, this has resulted in the prior art in a significantly reduced error detection and correction capability since the number of check bits available is reduced accordingly.

For example, the systematic BCH code for a fixed number of total codeword bits n exhibits an increased efficiency as the number of information bits k increases, but also exhibits an undesirable decreased error correction capability t since the number of redundant parity check bits r decreases, as shown in Table 1 below:

TABLE 1

| BCH Code Characteristics | | | | |
|---|---|---|---|---|
| n | k | r | efficiency | t |
| 15 | 5 | 10 | .33 | 3 |
|  | 7 | 8 | .47 | 2 |
|  | 11 | 5 | .73 | 1 |
| 63 | 24 | 39 | .38 | 7 |
|  | 36 | 27 | .57 | 5 |
|  | 39 | 24 | .62 | 4 |
|  | 45 | 18 | .71 | 3 |
|  | 51 | 12 | .81 | 2 |
|  | 57 | 6 | .90 | 1 |
| 255 | 63 | 192 | .25 | 30 |
|  | 115 | 140 | .45 | 21 |
|  | 179 | 76 | .70 | 10 |
|  | 199 | 56 | .78 | 7 |
|  | 215 | 40 | .84 | 5 |
|  | 223 | 32 | .87 | 4 |
|  | 231 | 24 | .91 | 3 |
|  | 239 | 16 | .94 | 2 |

It is therefore an object of the present invention to increase the channel coding efficiency for existing systematic block data transmission codes without increasing the codeword length and without substantially reducing the error detection and correction capability.

SUMMARY OF THE INVENTION

In accordance with this and other objects, the present invention is a method and apparatus for increasing the coding efficiency of a digital data transmission system which implements a predefined systematic coding algorithm to encode blocks of information bits into codewords prior to transmission. The codewords are characterized by each having a fixed number of bit positions n comprising k information bit positions concatenated with r check bit positions such that n=k+r. The transmission system implements, after transmission of said codewords, a predefined decoding algorithm corresponding to the encoding algorithm and capable of detecting and correcting for in each of the codewords t errors introduced during transmission. The coding algorithm has a normal coding efficiency of k/n.

The method of the present invention enables the increase of the coding efficiency of the system without changing the fixed codeword length n and without substantially reducing the error correction capability t. In accordance with the present invention, an r bit checkword is first generated from the existing systematic coding algorithm using the k information bits as its input. One bit of the r bit checkword, referred to as R(lost), is then truncated to form an r-1 bit checkword. The r-1 bit checkword is then concatenated with the k information bits and additional information bit K(added) to form the codeword of length n. The codeword is then transmitted in the usual fashion to a receiver. At the receiver's decoder, the additional information bit K(added) is shared and performs two functions —it represents the additional information bit K(added), and it is also "borrowed" to replace the previously truncated check bit R(lost). As a result, since k+1 information bits are transmitted, the coding efficiency of the transmission system is increased from k/n to (k+1)/n. Advantageously, the number of bit errors correctable by the system is only reduced to, on the average, t–½c, where c is a varying parameter which is a function of the bit error rate. For example, if the bit error rate is greater than $10^{-2}$, then c becomes close to the number 1. If, however, the bit error rate is smaller than $10^{-2}$, then c becomes close to the number 2.

If the code has t=m, then less than or equal to m−1 bits of checkbits can be borrowed. Moreover, not every code word needs to be modified; modification can be effecetd on a periodic basis.

Thus, the present invention is a method of increasing the channel coding efficiency while preserving the desired coding scheme selected by truncating a checkbit, adding in its place in the codeword transmitted an additional information bit, and borrowing the added information bit at the encoder to function as the truncated check bit.

In general, when the check bit R(lost) is truncated prior to transmission and subsequently borrowed from the information word during decoding at the receiver, a bit error may or may not be introduced. If the information bit K(added) happens to be the same binary value as the check bit R(lost) that was truncated, the code can still correct for t errors. Alternately, if the information bit K(added) happens to be the opposite binary value of the check bit R(lost) that was truncated, then a bit error has been introduced by the replacement, and the code can correct (t−1) errors. Thus, for a coding scheme designed to correct up to t bit errors, when a check bit is truncated and subsequently borrowed the code can correct either t bit errors (if a bit error is not introduced) or (t−1) bit errors (if a bit error is introduced). Assuming that binary ones and zeroes occur with equal likelihood, when a check bit is truncated and subsequently borrowed there is a probability of 50% that a bit error has been (intentionally) introduced. If each codeword has one check bit truncated and subsequently borrowed in order to carry an extra information bit, then the error correction capability of the code is reduced to an average of t–½c over a sequence of many code words.

A more general result is reached if only some code words in a sequence are used to add information bits. The reduced number of bit errors that can be corrected, $t_{r1}$, is:

$$t_{r1}=t-(p/2q) \quad (1)$$

where t is the number of bit errors the unmodified code can correct, and p is the number of code words in a q code word sequence where a check bit is truncated and borrowed.

Some systematic codes have the capability to correct many bit errors (3≦t), particularly if the errors occur in bursts. With t large, more than one check bit could be truncated and borrowed to carry information bits. The reduced number of bit errors that can be corrected, $t_{rm}$, when m check bits are borrowed is:

$$t_{rm}=t-(p/2^m q) \quad (2)$$

where t is the number of bit errors the unmodified code can correct, and p is the number of code words in a q code word sequence where m check bits are borrowed.

In addition to the potential for introducing a bit error in the checkword by truncating R(lost) and replacing it with K(added) as described above, there is also the potential that a bit error may be introduced by the transmission process itself. Thus, when the decoder detects an "error" in the bit position held by K(added), it does not know if the "error" was due to the intentional replacement at the encoder (for which there should be no correction), or if the "error" is in fact a real error introduced during transmission (for which there should be a correction). However, since the likelihood is substantially greater that the "error" was due to replacement at the decoder (approximately 50%) than during transmission, the modified decoder of the present invention is designed to leave K(added) as is and not correct it whether it detects an error or not. Thus, for a significant majority of the time, a detected yet uncorrected "error" in the K(added) bit position does not result in an erroneous decoded dataword.

Accordingly, there are four scenarios with differing impacts on the error correction capabilities of the modified system:

Case (A): No inversion due to replacement, no inversion during transmission.

Case (B): Inversion due to replacement, no inversion during transmission.

Case (C): No inversion due to replacement, inversion during transmission.

Case (D): Inversion due to replacement, inversion during transmission

Cases (C) and (D) occur much less frequently than do cases (A) and (B). The impact of the above four cases are explained in further detail in connection with the preferred embodiment of the invention as set forth below.

BRIEF DESCRIPTION OF THE DRAWING

FIG. 4 is a graph of a performance comparison of an uncoded system, a perfect single-error correcting system, a standard BCH (15, 7, 2) double-error correcting system, and the modified-BCH (15, 7+1, 1.5) one and one-half error correcting system of the present invention for an additive white gaussian noise model.

DESCRIPTION OF THE PREFERRED EMBODIMENT

The preferred embodiment of the present invention will now be described with reference to a standard BCH (15, 7) code adapted by the present invention to transmit one additional information bit with a modified-BCH (15, 7+1) code. The standard BCH (15, 7) code transmits a 15-bit codeword comprising a 7-bit dataword concatenated with an 8-bit checkword at an efficiency rate of 7/15, or 0.47. The standard code can correct for t=2 errors. The modified code will transmit a 15-bit codeword comprising an 8-bit dataword for an efficiency rate of 8/15, or 0.53. The modified code corrects for an approximate average of 1.5 errors at a bit error rate of less than $2 \times 10^{-2}$. In this example, the codeword will be transmitted over a wireless channel which has a raw channel bandwidth of 36 Kbps.

The normal coding efficiency of 7/15 results in 16.8 Kbps for information, and 19.2 Kbps for redundant check bits. It is desired to increase the information rate to 19.2 Kbps by modifying the BCH coding scheme selected. The information rate may be increased to 19.2 Kbps by borrowing one check bit from each code word. The standard BCH encoder and decoder circuits are modified such that the first check bit in each code word is truncated at the encoder and substituted at the decoder with an eighth information bit. The net result is that the information rate is increased to 19.2 Kbps with a only fractional degradation in error correction capability.

Figure 1:
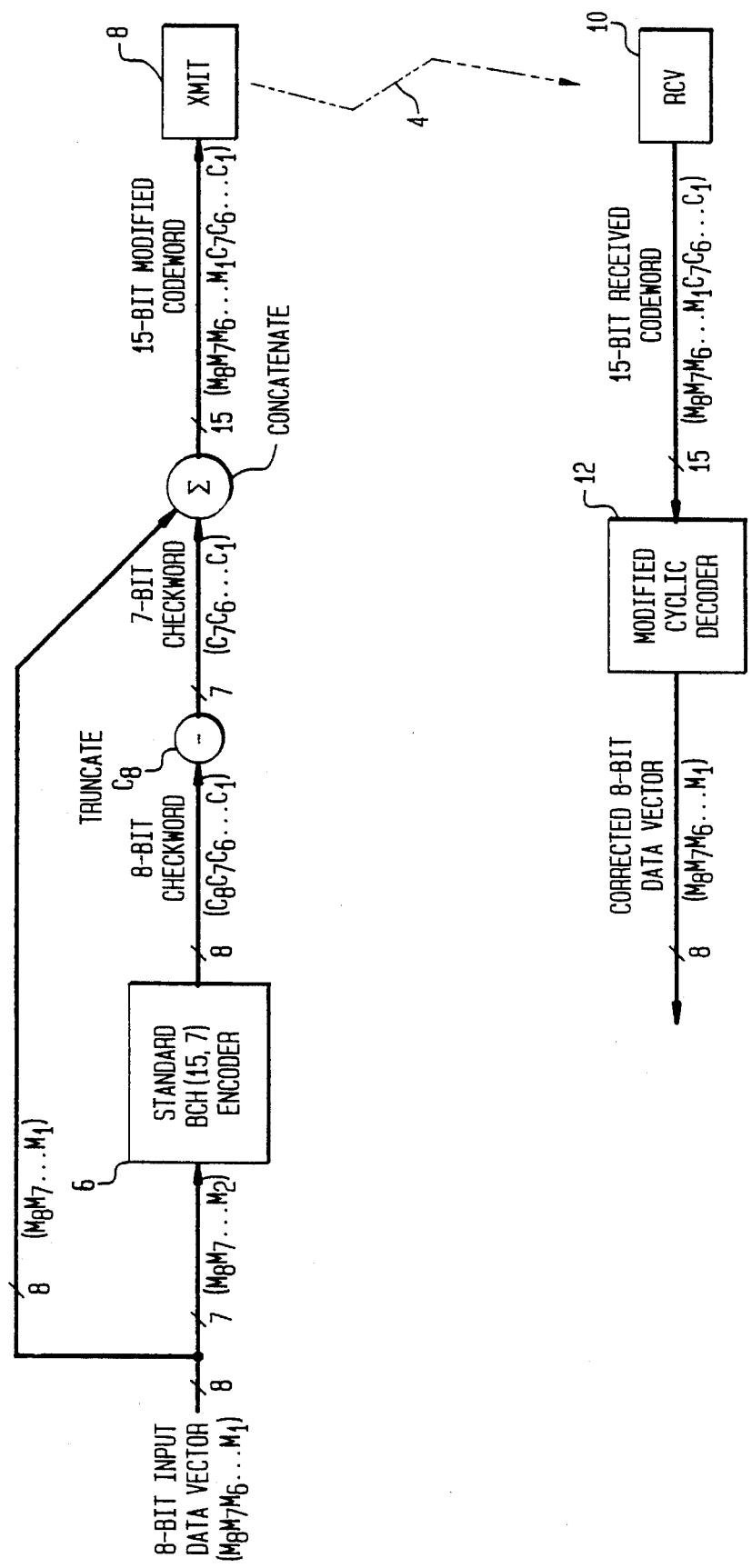
FIG. 1 is a system block diagram of a preferred embodiment of a digital transmission system of the present invention.

Referring to the system block diagram of FIG. 1, an 8-bit dataword $(m_8m_7m_6m_5m_4m_3m_2m_1)$ is desired to be transmitted to a remote location via a wireless communications channel 4. The seven most significant bits $(m_8m_7m_6m_5m_4m_3m_2)$ of the 8-bit dataword are input to a standard BCH(15, 7) encoder 6, which outputs a standard 8-bit checkword $(c_8c_7c_6c_5c_4c_3c_2c_1)$. BCH(15, 7) encoders are well known in the prior art. After encoding, the most significant bit $(c_8)$ is truncated, and the remaining 7 least significant bits $(c_7c_6c_5c_4c_3c_2c_1)$ are concatenated with the original 8-bit dataword $(m_8m_7m_6m_5m_4m_3m_2m_1)$ to form a 15-bit codeword $((m_8m_7m_6m_5m_4m_3m_2m_1c_7c_6c_5c_4c_3c_2c_1)$. The 15-bit codeword $(m_8m_7m_6m_5m_4m_3m_2m_1 c_7c_6c_5c_4c_3c_2c_1)$ is then transmitted over the wireless channel 4 from a transmitter 8 to a receiver 10 at a remote location for subsequent decoding and error detection and correction.

Figure 2:
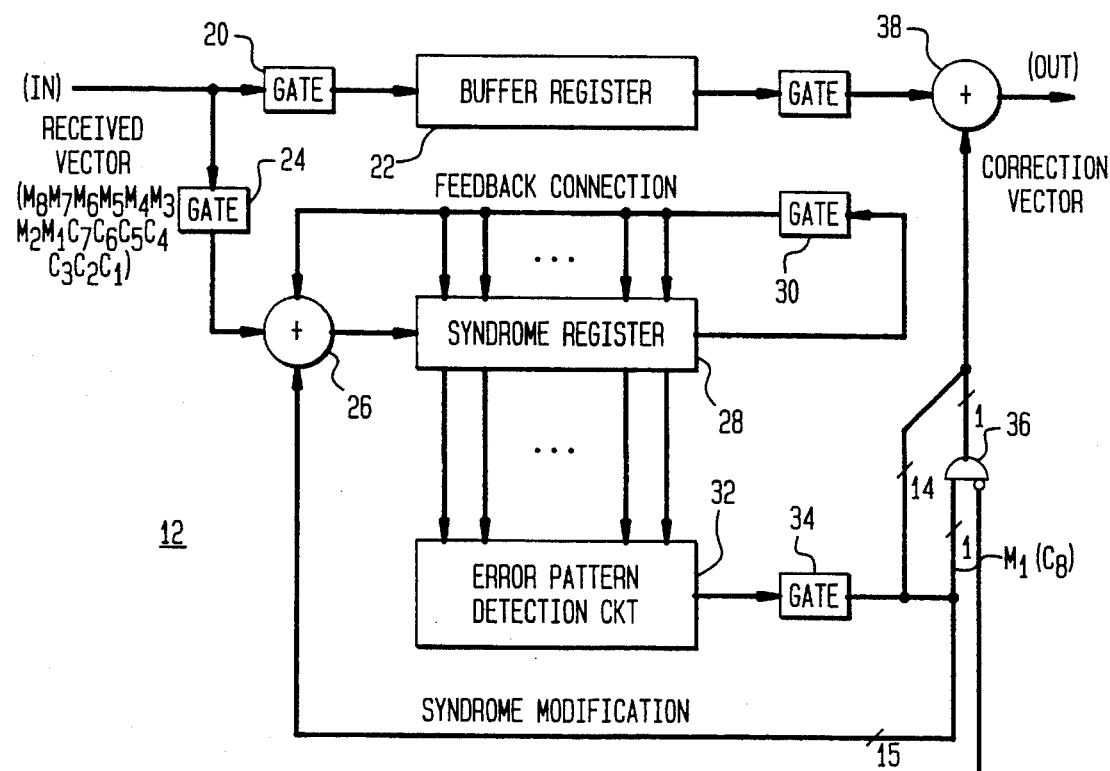
FIG. 2 is a block diagram of a BCH decoder modified to implement the preferred embodiment of the present invention.
Figure 3A:
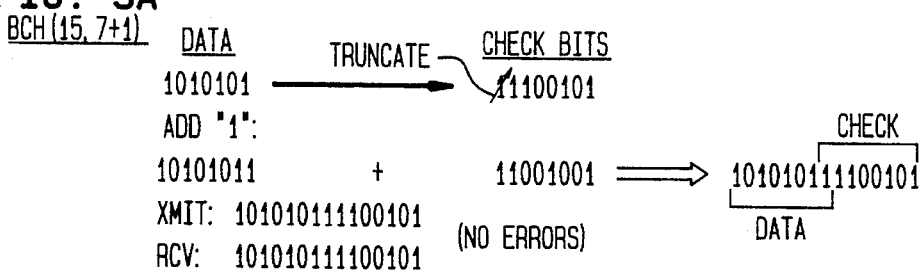
FIGS. 3A–3D are an illustration of the effect of the four bit inversion scenarios when practicing the preferred embodiment of the present invention.
Figure 3B:
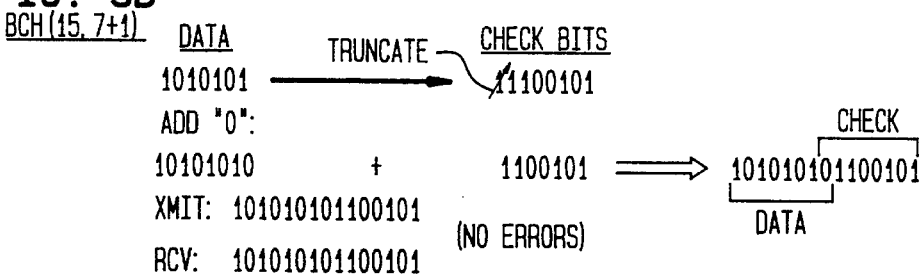
Figure 3C:
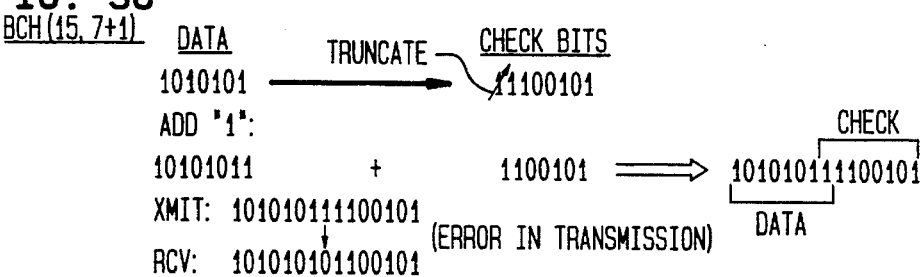
Figure 3D:
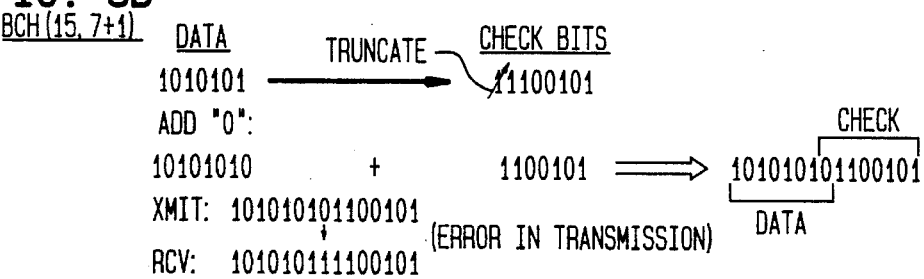

The 15-bit received codeword $(m_8m_7m_6m_5m_4m_3m_2m_1 c_7c_6c_5c_4c_3c_2c_1)$ is input to a modified cyclic decoder 12, which is illustrated in further detail in FIG. 2. The decoder 12 is a standard BCH(15, 7) decoder well known in the prior art, with the exception of an AND gate 36 which will be described below. In the preferred embodiment, a modified Meggitt decoder is used, although any type decoder for decoding a BCH (15, 7) code may be used as modified herein. Gate 20 enables passage of the received codeword $(m_8m_7m_6m_5m_4m_3m_2m_1 c_7c_6c_5c_4c_3c_2c_1)$ into buffer register 22, which holds the entire codeword during the decoding process. Gate 24 also enables passage of the received codeword $(m_8m_7m_6m_5m_4m_3m_2m_1 c_7c_6c_5c_4c_3c_2c_1)$ into adder 26, which comprises an array of 15 exclusive-OR gates for modulo-2 addition, wherein one exclusive-OR gate is dedicated for each bit in the received codeword. The 15-bit output vector of the adder 26 is input into a syndrome register 28, which is enabled by gate 30 in feedback relation back into the syndrome register 30 and into the adder 26. The syndrome register 28 is also provided to an error pattern detection circuit 32, the output vector of which is a syndrome modification vector which is enabled by gate 34 in feedback relation back to the adder 26. Gate 34 also enables the syndrome modification vector to be input into an adder 38, which comprises an array of 15 exclusive-OR gates, one for each bit of the codeword, in the same manner as the adder 26.

The prior art BCH(15, 7) decoder described above is modified by the present invention by the addition of a single AND gate 36 disposed between the syndrome modification vector, which is output by the gate 34, and the input to the adder 38. The single AND gate 36 controls only the bit position of the $m_1$ bit, which is also shared with, or borrowed by, the checkword to replace the previously truncated $c_8$ bit. The AND gate 36 is enabled by the enhanced mode control signal, which acts to prevent correction of the shared bit when enhanced mode is on (EMC is high), and allows normal correction of the bit when enhanced mode is selected to be off (EMC is low). The EMC signal can be selectively controlled by a hardware or software switch as desired. Thus, the modified BCH(15, 7+1) decoder behaves in the same way as a standard BCH(15, 7) decoder except that the shared bit position $m_1(c_8)$ is not corrected while all the other bits are.

As previously noted, the shared bit may encounter an error in either the replacement phase or in the transmission phase. There are thus four error scenarios with differing impacts on the error correction capabilities of the modified system:

Case (A): No inversion due to replacement, no inversion during transmission.

Case (B): Inversion due to replacement, no inversion during transmission.

Case (C): No inversion due to replacement, inversion during transmission.

Case (D): Inversion due to replacement, inversion during transmission

The above four cases will now be explained with reference to the following example, which utilizes the BCH code (15, 7) modified to (15, 7+1) of the preferred embodiment. Referring to Case (A) in FIG. 3, the desired 8-bit dataword $(m_8m_7m_6m_5m_4m_3m_2m_1)$ to be transmitted is 10101011. The first seven bits, $(m_8m_7m_6m_5m_4m_3m_2)$ =1010101, are input to the standard BCH (15, 7) encoder 6, which produces an 8-bit checkword $(c_8c_7c_6c_5c_4c_3c_2c_1)$ =11100101. The leading 1 of the checkword $(c_8)$ is truncated, and the least significant bit $(m_1)$ of the data word, 1, is added in its place (thus, no inversion at replacement). The resulting 15-bit codeword $(m_8m_7m_6m_5m_4m_3m_2m_1\ c_7c_6c_5c_4c_3c_2c_1)$ transmitted is 101010111100101, which is received without error and decoded. The modified cyclic decoder 12 detects that this is a proper codeword, and then passes on the first eight bits, $(m_8m_7m_6m_5m_4m_3m_2m_1)$= 10101011, as the received 8-bit data word. Thus, case (A) is the best case, since the full error correction capability t of the code is preserved, and the system 2 can still correct for t errors in the remainder of the codeword.

In case (B), the desired 8-bit dataword to be transmitted is now 10101010. The first seven bits, 1010101, are input to the standard BCH (15, 7) encoder 6, which again produces an 8-bit checkword of 11100101. The leading 1 of the checkword is likewise truncated, and the LSB of the data word, this time a 0, is added in its place (thus, inversion at replacement). The resulting 15-bit codeword transmitted is 101010101100101, which is received without further error and decoded. The decoder 12 detects that this is not a proper codeword, but nonetheless gates out via AND gate 36 any correction at the truncated/replaced bit position. This bit is not corrected since it is known to be more likely that the bit error was a result of inversion at replacement rather than during transmission. Thus, the decoder 12 passes on the first eight bits, 10101010, as the received 8-bit data word. As a result, there is no error in the dataword, but the error correction capability for the remaining bits is reduced according to equations (1) or (2) above since an error has in fact been detected.

In case (D), the desired 8-bit dataword to be transmitted is also 10101010. The first seven bits, 1010101, are input to the standard BCH (15, 7) encoder 6, which again produces an 8-bit checkword of 11100101. The leading 1 of the checkword is likewise truncated, and the LSB of the data word, this time a 0, is added in its place (thus inversion at replacement). The resulting 15-bit codeword transmitted is 101010101100101. In this scenario, an error occurs during transmission, which inverts the truncated/replaced bit to a 1, so that the received codeword is 101010111100101. In this case the decoder 12 detects no error, since this happens to be a valid codeword, and the dataword passed on is the 8-bit 10101011. Thus, there is an uncorrected error in the data, but there is no reduced error correction capability for the remaining bits since no error has been detected. As in case (B), the error correction capability has thus been reduced according to equations (1) or (2) above.

In case (C), the desired 8-bit dataword to be transmitted is 10101011. The first seven bits, 1010101, are input to the standard BCH (15, 7) encoder 6, which again produces an 8-bit checkword of 11100101. The leading 1 of the checkword is likewise truncated, and the LSB of the data word, this time a 1, is added in its place (thus, no inversion at replacement). The resulting 15-bit codeword transmitted is 101010111100101. An error occurs in this case during transmission, which inverts the truncated/replaced bit to a 0, so that the received codeword is now 101010101100101. In this case the decoder 12 detects an error in the bit position for the truncated/replaced bit, but has (erroneously) assumed that the bit error was a result of inversion at replacement rather than during transmission. That is, the AND gate 36 functions to disable error correction of the shared bit. Thus, the decoder passes on the first eight bits, 10101010, as the received 8-bit data word. As a result, there is an uncorrected error in the dataword, and the error correction capability for the remaining bits is reduced according to equations (1) or (2) above since an error has in fact been detected. Thus, the overall error correction capability has been effectively reduced from t to t−1, and case (C) is the worst case result.

Simulations were performed to compare the word error rates of the standard BCH (15, 7) to the modified-BCH (15, 7+1) of the preferred embodiment. A binary symmetric channel was used as the channel model to introduce randomly distributed bit errors to the transmitted information bit stream. FIG. 4 shows that at a bit error rate BER=$10^{-2}$, the probability of word error after decoding is 0.0004 for BCH (15, 7) and 0.012 for modified-BCH (15, 7+1). The additional 2.4 Kbps offered by the modified BCH (15, 7+1) code thus should be weighed against the increase in word error rate. For this example, the net increase in unerrored throughput may be found as follows:

$$\begin{aligned}
\text{net increase} &= (\text{unerrored throughput})_{modified} - \\
&\quad (\text{unerrored throughput})_{standard} \\
&= [(1 - 0.0120) \times 19.2 \text{ Kbps}] - \\
&\quad [(1 - 0.0004) \times 16.8 \text{ Kbps}] \\
&= 2.176 \text{ Kbps}
\end{aligned}$$

This calculation shows that at a BER=$10^{-2}$ the modified-BCH code increases the raw data throughput by about 14 percent and the unerrored throughput by about 13 percent (one percent of the data is lost due to the increased word error rate caused by the weakened error correction of the modified BCH code).

For an application where the information is of short frame lengths, e.g. ASCII characters, the modified code is useful because the effective unerrored throughput is increased. For an application where the information is of long frame lengths, i.e. a frame is constructed from multiple code words, the increased word error rate will cause the frame error rate to increase which will diminish the utility of the modified block code. How much the utility of the modified block code decreases can be determined by a Bernoulli probability calculation once the frame size is known (i.e. the number of code words in a frame).

For example, assume an information frame consists of 12-code words. At a relatively poor link BER=$10^{-2}$, the probability of frame error for an uncoded frame, a frame with BCH(15, 7), or modified-BCH (15, 7+1) is 0.84, 0.005, and 0.13 respectively. The modest 14 percent increase in data rate allocated by the modified-BCH coding is attained at the expense of increasing the frame error rate to 13 percent. For the same scenario except the link BER is improved to BER=$10^{-3}$, an uncoded frame, a frame with BCH (15, 7) or modified-BCH (15, 7+1) yield a probability of frame error of 0.17, 0.0047, and 0.006 respectively. With the lower BER, the frame error rate increase is minimal and most of the 14 percent increase in data rate provided by the modified-BCH code is utilized.

Referring to FIG. 4, the performance comparison of an uncoded system, a perfect single-error correcting system, a perfect double-error correcting BCH (15, 7, 2) system, and the modified-BCH (15, 7+1, 1.5) one and one-half error correcting system of the preferred embodiment of the present invention can be observed. The graph shows the probability of a word error after detection/correction at the receiver as a function of a given bit error rate for the various systems.

Clearly, the uncoded system has the highest probability of word error at all BERs since only pure information bits are transmitted and there is no means to correct for any errors.

The modified-BCH (15, 7+1, 1.5) has a lower probability of word error than does a perfect single-error correcting system at BER's higher than $1.6 \times 10^{-2}$, yet has a higher error probability at lower BERs. Thus, a design choice can also be made between the two systems depending on the BER of the transmission channel. Also, the BER can be estimated at the receiver and a decision made as to which code provides the best unerrored throughput.

Although the preferred embodiment described herein implements the present invention utilizing an encoder and decoder implemented in a hardware environment, it is understood that the invention may be implemented by other known means. For example, a digital signal processor may be used to implement the invention in software while remaining within the intended scope of the appended claims.

I claim:

1. In a digital data transmission system implementing a predefined systematic coding algorithm to encode blocks of information bits into codewords prior to transmission, wherein each of said codewords has a fixed number of bits n comprising a fixed number of information bits k concatenated with a fixed number of check bits r such that n=k+r, and wherein said transmission system implements after transmission of said codewords a predefined decoding algorithm corresponding to said encoding algorithm and capable of detecting and correcting for each of said codewords t errors introduced during transmission, wherein said coding algorithm has a coding efficiency of k/n;

a method for increasing the coding efficiency of the system without changing the fixed codeword length n, said method comprising the steps of:

(a) generating a checkword having r check bits, wherein r is greater than 1, from the systematic coding algorithm using an information word having k information bits as its input;

(b) truncating one bit R(lost) of said checkword to form a modified checkword having r-1 check bits;

(c) forming a codeword having n bits by concatenating said information word with an additional information bit K(added) and said modified checkword;

(d) transmitting said codeword to a receiver;

(e) borrowing said additional information bit K(added) to replace said truncated check bit R(lost) in the decoding algorithm; and (f) decoding said codeword utilizing the predefined decoding algorithm;

whereby the coding efficiency of the transmission system is increased to (k+1)/n.

2. The method of claim 1 further comprising the step of disabling correction of the additional information bit K(added) in the error correction portion of the decoding algorithm.

3. The method of claim 1 in which steps (a) through (f) are performed for p codewords out of a total sequence of q codewords; whereby the number of bit errors that can be corrected by the system is t−(p/2q).

4. The method of claim 1 in which steps (a) through (f) are performed for every codeword in a sequence; whereby the number of bit errors that can be corrected by the system is t−(½).

5. In a digital data transmission system implementing a predefined systematic coding algorithm to encode blocks of information bits into codewords prior to transmission, wherein each of said codewords has a fixed number of bits n comprising a fixed number of information bits k concatenated with a fixed number of check bits r such that n=k+r, and wherein said transmission system implements after transmission of said codewords a predefined decoding algorithm corresponding to said encoding algorithm and capable of detecting and correcting for each of said codewords t errors introduced during transmission, wherein said coding algorithm has a coding efficiency of k/n;

a method for increasing the coding efficiency of the system without changing the fixed codeword length n, said method comprising the steps of:

(a) generating a checkword having r check bits, wherein r is greater than 1, from the systematic coding algorithm using an information word having k information bits as its input;

(b) truncating m bits of said checkword, wherein m is less than r, to form a modified checkword having r-m check bits;

(c) forming a codeword having n bits by concatenating said information word with m additional information bits and said modified checkword;

(d) transmitting said codeword to a receiver;

(e) borrowing said m additional information bits to replace said truncated check bits in the decoding algorithm; and (f) decoding said codeword utilizing the predefined decoding algorithm;

whereby the coding efficiency of the transmission system is increased to (k+m)/n.

6. The method of claim 5 further comprising the step of disabling correction of the m additional information bits in the error correction portion of the decoding algorithm.

7. The method of claim 5 in which steps (a) through (f) are performed for p codewords out of a total sequence of q codewords; whereby the number of bit errors that can be corrected by the system is $t-(p/2^m q)$.

8. The method of claim 5 in which steps (a) through (f) are performed for every codeword in a sequence; whereby the number of bit errors that can be corrected by the system is $t-(\frac{1}{2}^m)$.

9. A digital data transmission system comprising (a) encoding means for implementing a predefined systematic coding algorithm to encode blocks of information bits into codewords prior to transmission, wherein each of said codewords comprises an information word having a fixed number of information bits k concatenated with a checkword having a fixed number of check bits r thereby forming a codeword having a fixed number of bits n such that n=k+r;

(b) means to truncate one check bit R(lost) from said checkword to form a modified checkword having r-1 check bits;

(c) means to concatenate said information word with an additional information bit K(added) and said modified checkword to form an n-bit codeword;

(d) means for transmitting said codeword over a communications channel;

(e) means to receive said codeword from said communications channel; and (f) decoding means for implementing after reception of said codewords a predefined decoding algorithm corresponding to said encoding algorithm and capable of detecting and correcting for each of said codewords t errors introduced during transmission; said decoding means being capable of borrowing said additional information bit K(added) to replace said truncated check bit R(lost) in the decoding algorithm;

whereby the coding efficiency of the transmission system is increased to (k+1)/n.

10. The digital data transmission system of claim 9 further comprising:

(g) gating means to selectively disable correction of the additional information bit K(added) in the error correction portion of the decoding algorithm.

11. The digital data transmission system of claim 10 wherein said gating means is an AND gate.

12. A digital data transmission system comprising:

(a) a BCH (15, 7) encoder which generates a 15-bit codeword in the form $(m_8 m_7 m_6 m_5 m_4 m_3 m_2 c_8 c_7 c_6 c_5 c_4 c_3 c_2 c_1)$, wherein $(m_8 m_7 m_6 m_5 m_4 m_3 m_2)$ represents the first seven bits of an eight bit information word desired to be transmitted and $(c_8 c_7 c_6 c_5 c_4 c_3 c_2 c_1)$ represents an 8-bit checkword generated by said BCH (15, 7) encoder as a result of inputting said seven information bits $(m_8 m_7 m_6 m_5 m_4 m_3 m_2)$;

(b) means to truncate $(c_8)$ and add in its place the information bit $(m_1)$ and thus provide a modified 15-bit codeword $(m_8 m_7 m_6 m_5 m_4 m_3 m_2 m_1\ c_7 c_6 c_5 c_4 c_3 c_2 c_1)$;

(c) means for transmitting said modified codeword $(m_8 m_7 m_6 m_5 m_4 m_3 m_2 m_1\ c_7 c_6 c_5 c_4 c_3 c_2 c_1)$ over a communications channel;

(d) means to receive said modified codeword $(m_8 m_7 m_6 m_5 m_4 m_3 m_2 m_1\ c_7 c_6 c_5 c_4 c_3 c_2 c_1)$ from said communications channel; and (e) a BCH (15, 7+1) decoder comprising a BCH (15, 7) decoder modified so that the $(m_1)$ bit is also used as $(c_8)$ in a decoding algorithm and further modified so that the correction for the $(m_1/c_8)$ bit is gated out by a selective control signal as desired;

whereby the coding efficiency of the transmission system is increased to 8/15.

* * * * *